United States Patent

Ekstrand

[15] 3,698,821

[45] Oct. 17, 1972

[54] METHOD AND APPARATUS FOR INSPECTING PLATED-THROUGH PRINTED CIRCUIT BOARD HOLES

[72] Inventor: James Ekstrand, Azusa, Calif.

[73] Assignee: Burroughs Corporation, Detroit, Mich.

[22] Filed: Aug. 19, 1971

[21] Appl. No.: 173,142

[52] U.S. Cl. ....................356/237

[51] Int. Cl. ....................G01n 21/16

[58] Field of Search ......356/201, 237, 239; 250/216, 250/218, 219, 220

[56] References Cited

UNITED STATES PATENTS

| | | | |
|---|---|---|---|
| 3,422,272 | 1/1969 | Brosious et al. | 356/237 |
| 3,558,900 | 1/1971 | Moskowitz | 356/237 |

*Primary Examiner*—William L. Sikes
*Attorney*—Paul W. Fish et al.

[57] ABSTRACT

In testing plated-through holes in finished circuit boards, light from a light source is introduced into the light-conducting substrate of a printed circuit board but is prevented from entering the plated-through holes of the substrate by a hole masking template. A light detector senses light in the holes, such light having entered through a defective hole wall from the substrate. In an alternate embodiment, light from a light source is channeled into the plated-through holes in a light-conducting substrate, but prevented from entering the substrate by a substrate masking template. A light detector senses light emanating from the substrate adjacent to a hole, such light having entered the substrate, from the hole, through a defective hole wall.

19 Claims, 7 Drawing Figures

METHOD AND APPARATUS FOR INSPECTING PLATED-THROUGH PRINTED CIRCUIT BOARD HOLES

BACKGROUND OF THE INVENTION

The present invention relates generally to improvements in methods and apparatus for inspecting plated-through holes in printed circuit boards, and more particularly pertains to new and improved methods and apparatus for inspecting plated-through circuit boards wherein a light source is used to aid in the inspection process.

In the field of plated-through hole inspection in printed circuit boards, it has been the general practice to inspect such holes either manually or electrically . Manual inspection is accomplished through the utilization of a microscope. This requires that each hole be inspected individually, which is time consuming and, in addition, very fatiguing to the inspector. Moreover, defects in hole plating, such as cracked walls, are difficult to see even with a microscope. Electrical testing of plated-through holes by conductivity testers, for example, requires expensive equipment. In addition, the electrical detection equipment, at the present state of the art, may not detect some smaller or less extensive (not electrically open) cracks in the wall plating.

SUMMARY OF THE INVENTION

It is, therefore, an object of the present invention to provide a method and apparatus for inspecting plated-through printed circuit board holes that will not fatigue an operator and that provide a reliable method of detecting faults in the walls of plated-through printed circuit board holes.

This object and the general purpose of the invention is accomplished by introducing light from a source of light into the interior of a light-conducting type of printed circuit board substrate and preventing light from directly entering the plated-through holes in the substrate. Light detected in the holes is, therefore, an indication of a faulty hole wall through which light from the interior of the substrate could enter the hole.

Alternately, light is directly introduced into the plated-through holes and prevented from entering the interior of the substrate. Any light detected in the substrate adjacent to the hole is an indication of a faulty hole wall through which light from within the hole could enter the substrate.

DESCRIPTION OF THE DRAWINGS

The exact nature of this invention as well as other objects and advantages thereof, will be readily appreciated as the same becomes better understood by reference to the following detailed description when considered in connection with the accompanying drawings in which like reference numerals designate like parts throughout the figures thereof and wherein.

DESCRIPTION OF THE PREFERRED EMBODIMENT

Figures 1, 2, 3, 4:
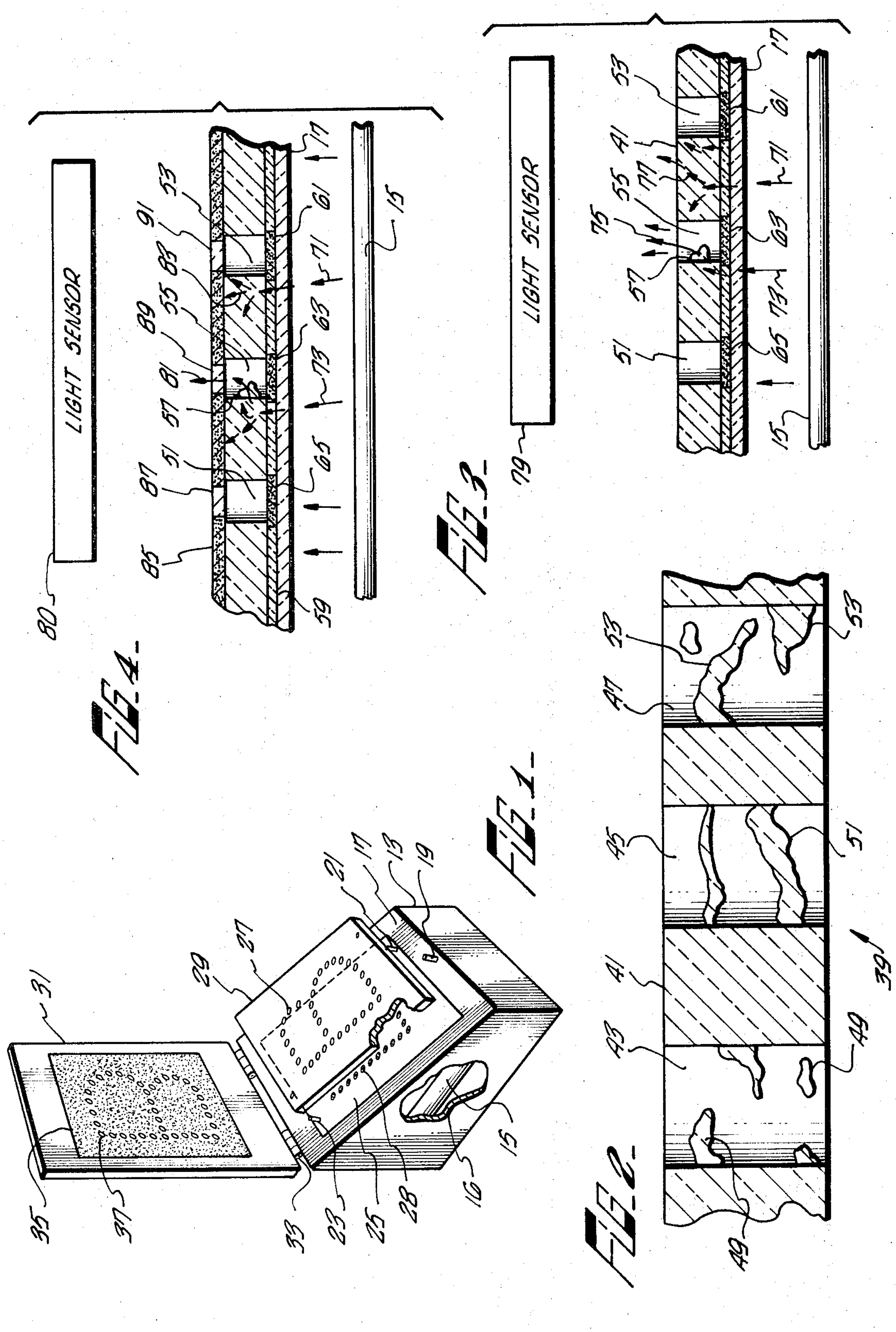
FIG. 1 is a perspective view, partially broken away, of the preferred embodiment of this invention.
FIG. 2 is a cross-section representation of several plated-through circuit board holes having various types of defects.
FIG. 3 is a cross-sectional view illustrating one method and apparatus for practicing the invention.
FIG. 4 is a cross-sectional view illustrating a method and apparatus for practicing the invention that is a slight modification of the method and apparatus of FIG. 3.

FIG. 1 illustrates an inspection box 13 with a source of light 15 (shown through broken away section 16) mounted within it. The box has a translucent top 17, which may be slanted for easy inspection. A translucent template 25 having opaque dots 28 therein corresponding in location with the plated-through holes 27 of a printed circuit board 29 to be inspected, is precisely positioned on the translucent top 17 by guiding pins 21, 23. The guiding pins 21, 23 are of sufficient length to receive the printed circuit board 29 and to align the plated-through holes 27 with the opaque dots 28 of the template 25.

A coverplate 31 attached to one top edge of the inspection box 13 by hinges 33 is adapted to receive a template 35. The template 35 has apertures 37 therein that correspond in location to the holes 27 in the printed circuit board 29. The coverplate 31 is adapted to receive and hold the template 35, in a well known manner, so that the holes 37 in the template 35 are in alignment with the holes 27 in the printed circuit board. The apertures 37 in the template 35 are slightly smaller in diameter than the holes 27 in the printed circuit board.

Rotating the coverplate 31, with the template 35 therein, about its hinges 33 so the template 35 overlays the top of the printed circuit board 29 causes a switch 19, located in the translucent top 17, to activate and turn the light 15 in the inspection box 13 on.

At this point an operator views the top of the box. Because of the top mask 35, his eye only perceives the holes of the printed circuit board. Because of the bottom mask 25, light from the light source 15 is prevented from directly entering the holes 27 of the printed circuit board. Any light that the human eye perceives in a hole, therefore, must have passed from the interior of the printed circuit board into the hole through a defect in the plating of the hole. Upon detecting light in a particular hole, the operator marks the hole to indicate that this particular hole on the printed circuit board is defective.

If the plating defects on the hole walls generally run small, light passing from the interior of a printed circuit board into a hole may not be sufficient in intensity to be distinguished from the ambient light in the viewing room. In such a case, it is desirable to view the holes in a room having subdued lighting or no ambient i.e. i.e. dark room, depending on how greatly the ambient light interferes with the detection of defectively plated holes.

The concept of this invention is not limited to manual detection of light that is indicative of a defective plated-through hole wall. Nor, is it limited to the use of templates that mask the holes on one side of the printed circuit board and/or the printed circuit board itself, on the other side. FIG. 1, therefore, merely illustrates one possible embodiment of the present invention.

To better understand the scope of the invention, FIG. 2 presents an illustration of what is to be detected, i.e. faults in the walls of plated-through holes.

A cross-sectional segment 39 of a light-conducting substrate 41 having three plated-through holes, 43, 45, 47 therein is shown in FIG. 2. The three holes are illustrated as having plating defects in their walls. Plated-through hole 43, for example, has defects or voids 49 in its wall. These defects are areas on the wall surface that were not covered by conductive material during the plating process. The defects 49, in hole 43, are not the type that circumscribe a wall surface and, therefore, they would probably not interfere with most electrical interconnections made in that hole. Hole 45, on the other hand, has wall defects 51 that circumscribe the wall surface in a manner that would interfere with electrical interconnections made in that hole. Hole 47 is another example of plating defects 53 on the walls of plated-through holes in printed circuit boards that do not circumscribe the wall surface, but are more serious than the defects illustrated in hole 43, because they are larger.

In order for the invention to operate, the substrate 41 used for the printed circuit boards that are to be inspected for hole wall plating defects must be made from a light-conducting material, a material that is either transparent or translucent, or that diffuses light but allows it to pass through the material. A substantial number of well-known synthetic resins on the market today, from which a great many printed circuit boards are being made, possess the light-conducting characteristics necessary to this invention.

FIG. 3 illustrates one manner of detecting a defect in a plated-through printed circuit board hole.

A template 59 having opaque dots 65, 63, 61 thereon that correspond, in location, to the holes in printed circuit board 41 is placed on a translucent surface 17 over a light source 15, and a printed circuit board 41 having light-conducting properties and plated holes 51, 55, 53 therein is placed on top of the template 59, so the plated holes 51, 55, 53 are in alignment with the opaque dots 65, 63, 61. A light sensor 79, responsive to a light intensity greater than a predetermined threshold is located over printed circuit board 41 to detect light emanating from the board. Light sensor 79, rather than being a sensor capable of sensing light from any part of the circuit board, may be light sensor set up to scan individual sections of a circuit board or each hole in the board sequentially. These types of light detection methods are well known in the art and do not comprise a part of this invention.

The light rays from source 15 radiate towards the light conducting printed circuit board substrate 41. Because of opaque surfaces 61, 63, 65 being interposed between the light source and the plated-through holes, no light can enter the plated-through holes. It should be understood, of course, that the plating material used to plate the inside wall of the holes in the printed circuit board substrate is a conductive material that is impervious to light, reflecting it, rather than letting it pass through or absorbing it.

Assuming, for example, that a plating fault 57 has occurred in the wall of plated-through hole 55, light rays 73 would enter the substrate 41, be diffused and a portion thereof would pass through the plating fault 57 into an adjacent hole 55, exiting to the atmosphere through the hole 55 as light rays 75. Other light rays not entering the defect 57 in the wall of the hole 55, light rays 71, for example, will enter the substrate 41 and be diffused into rays 77 that exit the substrate at its surface. The light sensor 79 will respond to the light rays 75 exiting the substrate interior through a hole, to indicate a defective plated-through wall, and will not respond to light rays 77 exiting from the surface 41 because the intensity of the light rays 75 leaving through a hole is greater than the intensity of the light rays 77 leaving the surface of the substrate. The light rays leaving the surface of the substrate 41, because of the characteristics of the material, is diffused within the substrate, whereas the light rays entering a hole through a defect in the plated wall surface are not so diffused. The light reflection characteristic of the wall plating in a hole tends to concentrate the light within it.

It may be desirable to utilize a light sensor 79 that has a very low sensing threshold, in other words, one that is very sensitive and therefore can detect extremely low intensity light or a light sensor that cannot discriminate between light intensity. In order to utilize such light sensors, the background light 77 emanating from the surface of a substrate must be decreased to a minimum.

To accomplish this, a background light template that is opaque over its entire surface having apertures 87, 89, 91 therein (FIG. 4) that correspond in location to the holes in the printed circuit board is interposed between the surface of the printed circuit board being sensed and a light sensor 80. The apertures 87, 89, 91 are slightly smaller in diameter than the holes which they overlay, therefore ensuring that very little light from within the substrate can leak through the apertures. As was explained earlier, a light beam 73 from a light source 15 will enter the substrate and be diffused. If a defect, such as 57 is present in the hole wall of a hole 55, the light will enter the hole through the defect and exit, in this case, through aperture 89 of the template 85. On the other hand, light rays, such as 71, that are diffused at a point 83 in the substrate with no nearby imperfect hole wall to penetrate will try to exit the surface of the substrate without success, because of the opaque nature of the background light template 85. Therefore, the light sensor 79 will be exposed to light that is an indication of an imperfect hole wall, and any ambient light in the environment. If the test environment has no ambient light, i.e., a dark room, the light sensor 79 will only be exposed to light that is an indication of an imperfact hole wall.

Figure 6:
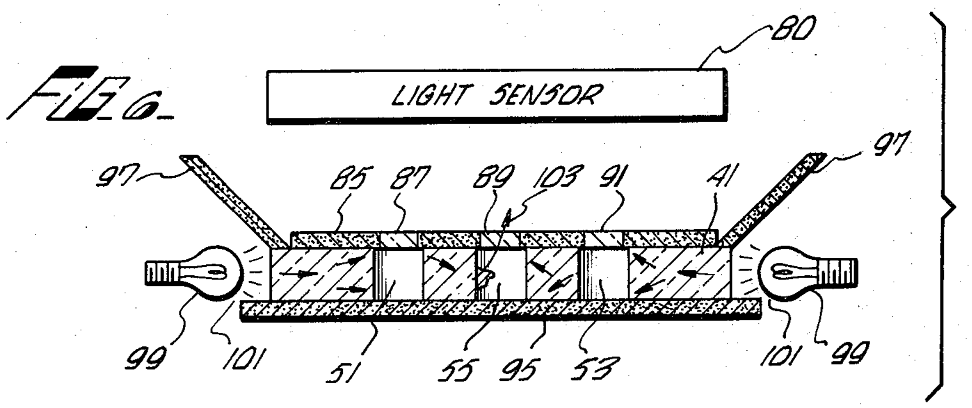
FIG. 6 is a cross-sectional view illustrating a method and apparatus for practicing the invention that is a slight modification of the method and apparatus for practicing the invention.
Figure 5:
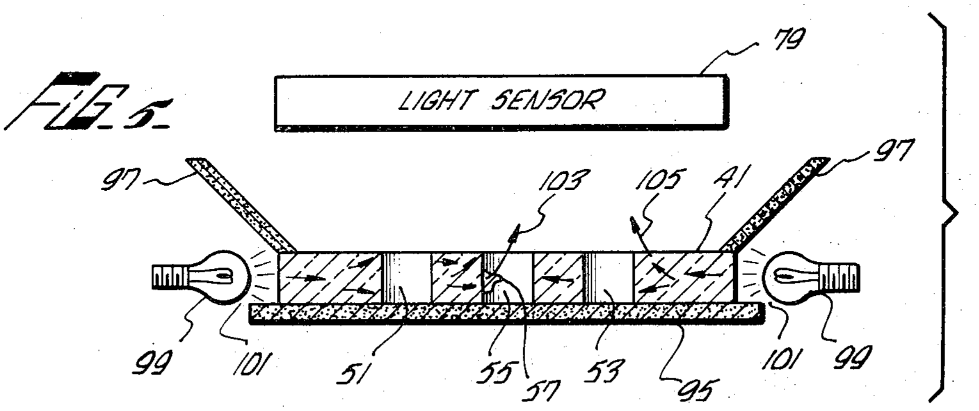
FIG. 5 is a cross-sectional view illustrating a further modified method and apparatus for practicing the invention.

FIGS. 5 and 6 illustrate a modified way of utilizing a light source to detect imperfect wall surfaces in plated-through printed circuit board holes. A substrate 41 having plated-through holes 51, 55, 53 therein, is placed on an opaque surface 95 and opaque light baffles 97 are adjusted into position on the other surface of the substrate 41, at its edges. If desired, the baffles may be sealed to the substrate 41. Light source 99 is placed at the edges of the substrate 41 behind the opaque light baffles 97. Light rays 101 from the light sources 99 penetrate into the interior of the substrate 41 through the edges thereof and are diffused throughout the interior of the substrate.

Assuming a wall defect 57 is present in a plated-through hole 55, light within substrate 41 will exit through this defect and appear to come out of plated-through hole 55 as light rays 103. It must be remembered that other light within substrate 41 also exits the substrate's surface as light rays 105. However, light coming from within a hole has a greater intensity than this background light because it is somewhat concentrated by the hole. A light sensor 79 which is insensitive to light below a certain threshold level but responds to the greater intensity light coming from a hole, is placed nearest the surface of the substrate 41 from which light is emanating. A light sensor 79, as was previously stated and is well know, may be adjusted to respond to the greater intensity light rays 103 and be insensitive to the background light rays 105 emanating from the surface of the substrate 41.

If an extra sensitive light sensor or a nondescriminating light sensor 80, is to be used, a template 85 that is opaque, in other words, impervious to light, having apertures 87, 89, 91 therein, is placed over the substrate between the light sensor 80 and the surface from which the light is emanating so that the holes 51, 55, 53 in the substrate align with the holes 87, 89, 91 in the template 85. This template, therefore, only permits light from a hole to leave the surface of the substrate, to be detected by the light sensor 80.

Figure 7:
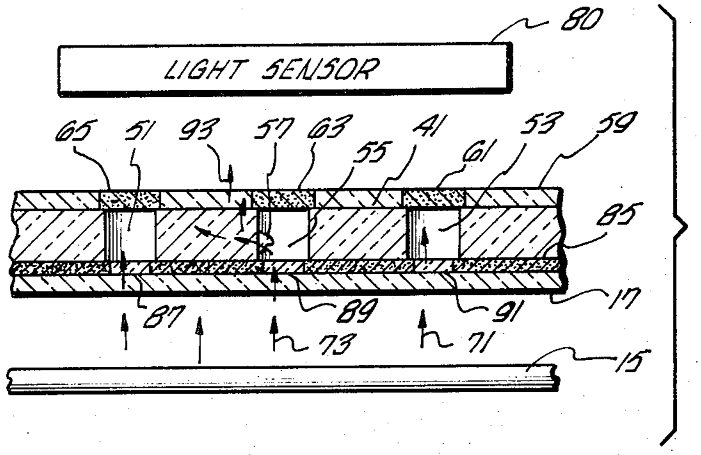
FIG. 7 is a cross-sectional view, illustrating an alternate method and apparatus for practicing the invention.

FIG. 7 illustrates an alternate manner of practicing the invention. A template of opaque material, in other words, impervious to light, having apertures 87, 89, 91 therein, located in alignment with the holes in the printed circuit board substrate 41 is placed on a translucent surface 17 over a light source 15. A light-conducting substrate 41 having holes 51, 55, 53 therein is placed over the template 85 having apertures 87, 89, 91 therein so that the holes 51, 55, 53 in the printed circuit board align with the holes 87, 89, 91 in the template. This template 85 only permits light to enter the plated-through holes 51, 55, 53, blocking light from entering the substrate 41. Another template 59 having opaque areas 61, 63, 65 thereon that align with the holes in the substrate 41 is interposed between the other side of substrate 41 and a light sensor 80. This template 59, in effect, therefore, prevents light that has entered one end of the plated-through holes 51, 55, 53 from leaving through the other end of the plated-through holes. If a plated-through hole, however, has a defect in its wall plating, light inside the plated-through hole will be able to escape through the defectively plated wall into the substrate itself where it is diffused and emerges from the surface of the substrate.

This is illustrated in FIG. 7 by light rays 73 entering plated-through hole 55 which has a defect 57 in its wall, permitting light rays 93 to emanate from the surface of the substrate to be detected by a light sensor 79. However, light rays 71 for example, entering a perfect hole 53 have no escape route because the wall plating of the hole 53 has no defects therein, therefore no light will emanate from the substrate 41 in the vicinity of an acceptable hole 53.

In summary the present invention permits either unaided manual or automatic inspection of plated-through holes in printed circuit boards by use of the contrast in intensity of light emanating from a plated-through hole and from the surface of a light conducting printed circuit board substrate, one of which must have travelled through a plating defect, to detect the presence of a plating defect in the wall of a plated-through hole.

It should be understood, of course, that the foregoing disclosure relates to only preferred embodiments of the invention and that numerous modifications or alterations may be made therein without departing from the spirit and the scope of the invention as set forth in the appended claims.

What is claimed is:

1. Apparatus utilizing a source of light for inspecting plated-through holes in printed circuit boards made of light-conducting material, comprising:
   means for introducing light from said source into the interior of said printed circuit board, said means preventing light from directly entering the plated-through holes in said board; and
   means for detecting the presence of light within a plated-through hole in said board, said detected light entering said hole through a defectively plated wall of said hole from the interior of said printed circuit board.

2. The apparatus of claim 1 wherein said means for introducing light into the interior of said board and preventing light from directly entering said plated-through holes in an opaque mask for each hole in said board, said opaque mask being slightly larger in diameter than the diameter of the hole it masks, said mask being interposed between said source of light and the hole.

3. The apparatus of claim 1 wherein said means for introducing light into the interior of said board and preventing light from directly entering said plated-through holes is a plurality of opaque dots on a template of translucent material, said opaque dots corresponding in location to the plated-through holes in a particular printed circuit board being inspected.

4. The apparatus of claim 1 wherein said means for introducing light into the interior of said light-conducting printed circuit board and preventing light from directly entering said plated-through holes is means for directing light into the edges of said board.

5. The apparatus of claim 4 wherein said directing means is opaque baffles positioned adjacent to the surface of said light conducting printed circuit board along the edges receiving light from said source.

6. The apparatus of claim 5 further comprising means for preventing light in the interior of said light-conductive circuit board from emanating through a surface thereof.

7. The apparatus of claim 6 wherein said means for preventing light from emanating through a surface from the interior of said board is an opaque template, having apertures therein corresponding to the plated-through holes in the particular printed circuit board inspected, said template being disposed on said surface.

8. The apparatus of claim 1 further comprising means for preventing light in the interior of said light-conductive circuit board from emanating through a surface thereof.

9. The apparatus of claim 8 wherein said means for preventing light from emanating through a surface from the interior of said board is an opaque template having apertures therein corresponding in location and being slightly smaller in diameter than the diameter of the plated-through holes in the particular printed circuit board being inspected, said template being disposed on said surface.

10. Apparatus utilizing a source of light for inspecting plated-through holes in printed circuit boards made of light-conducting material, comprising;

means for introducing light from said source directly into the plated-through holes in said board, said means preventing light from said source from entering the interior of said printed circuit board;

means for preventing light within the holes from emanating from said holes, said means not preventing light from emanating from the interior of said board; and means for detecting the presence of light emanating from the interior of said board contiguous to a plated-through hole, said light entering the interior of said board through a defectively plated wall of said hole.

11. The apparatus of claim 10 wherein said means for introducing light directly into said plated-through holes is an opaque template, having apertures therein corresponding in location and slightly smaller in diameter than the diameter of the plated-through holes in the particular printed circuit board being inspected, said template being disposed on the board surface through which light is introduced into said holes.

12. The apparatus of claim 10 wherein said means for preventing light in said holes from emanating from said holes, is a translucent template having opaque dots thereon corresponding in location and slightly larger in diameter than the diameter of the plated-through holes in the particular printed circuit board being inspected, said template being disposed on the surface, through which light is emanating.

13. A method of detecting defectively plated-through holes in a light-conducting type printed circuit board comprising the steps of:

introducing light into the interior of said printed circuit board; and detecting the presence of light within a plated-through hole, said light arriving through a defectively plated wall of the hole, from the interior of said printed circuit board.

14. A method of inspecting printed circuit boards made of light-conducting material for defectively plated-through holes in said board comprising:

masking said plated-through holes on one side of said circuit board with an opaque material;

directing a light to impinge said one side of said circuit board; and detecting the presence of light within a plated through hole, said light entering said hole through a defectively plated wall of said hole.

15. The method of claim 14, after the step of masking one end of said holes and prior to the step of directing a light to impinge said board, further comprising the step of masking the other side of said circuit board with a template of opaque material having apertures therein corresponding in location to the holes in said board.

16. A method of inspecting printed circuit boards made of light-conducting material for defectively plated-through holes in said board, comprising:

masking said plated-through holes on one side of said circuit board with an opaque material;

masking the other side of said circuit board with a template of opaque material having apertures therein corresponding to the holes in said board;

directing a light to impinge said other side of said circuit board; and detecting the presence of light, emanating from the interior of said board contiguous to a plated-through hole, said light entering the interior of said board through the defectively plated wall of said hole.

17. A method of inspecting printed circuit boards made of light-conducting material for defectively plated-through holes in said board, comprising:

directing light only upon the edges of said printed circuit board; and detecting the presence of light within a plated-through hole, said light entering said hole through a defectively plated wall of said hole.

18. The method of claim 17, prior to the step of directing light only upon the edges of said printed circuit board, further comprising the step of masking one side of said circuit board with an opaque material.

19. The method of claim 18, after the step of masking one side and prior to the step of directing a light, further comprising the step of masking the other side of said circuit board with a template of opaque material having apertures therein corresponding to the holes in said board.

* * * * *